United States Patent
O'Brien

(10) Patent No.: US 9,356,211 B2
(45) Date of Patent: May 31, 2016

(54) OPTOELECTRONIC COMPONENT AND METHOD OF PRODUCING AN OPTOELECTRONIC COMPONENT

(71) Applicant: OSRAM Opto Semiconductors GmbH, Regensburg (DE)

(72) Inventor: David O'Brien, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/420,961

(22) PCT Filed: Aug. 21, 2013

(86) PCT No.: PCT/EP2013/067383
§ 371 (c)(1),
(2) Date: Feb. 11, 2015

(87) PCT Pub. No.: WO2014/029804
PCT Pub. Date: Feb. 27, 2014

(65) Prior Publication Data
US 2015/0221840 A1    Aug. 6, 2015

(30) Foreign Application Priority Data

Aug. 24, 2012    (DE) .......................... 10 2012 107 829

(51) Int. Cl.
*H01L 33/60* (2010.01)
*H01L 21/58* (2006.01)
(Continued)

(52) U.S. Cl.
CPC ............ *H01L 33/60* (2013.01); *B29C 45/0053* (2013.01); *B29D 11/00865* (2013.01); *H01L 25/0753* (2013.01); *H01L 33/483* (2013.01); *B29K 2101/00* (2013.01);
(Continued)

(58) Field of Classification Search
CPC  B29D 11/00865; H01L 33/486; H01L 33/60; H01L 2924/0002; H01L 25/0753; H01L 2933/0033; H01L 33/483; H01L 2933/0058; B29C 45/0053
USPC .................... 438/106; 257/E21.505; 264/129
See application file for complete search history.

(56) References Cited

U.S. PATENT DOCUMENTS

2005/0067628 A1    3/2005  Kuwabara et al.
2007/0030675 A1    2/2007  Oon et al.
(Continued)

FOREIGN PATENT DOCUMENTS

DE    102004046995    6/2005
DE    102005028748    5/2006
(Continued)

OTHER PUBLICATIONS

English translation of Japanese Office Action dated Sep. 29, 2015 of corresponding Japanese Application No. 2015-527904.

*Primary Examiner* — Evan Pert
*Assistant Examiner* — Changhyun Yi
(74) *Attorney, Agent, or Firm* — DLA Piper LLP (US)

(57) ABSTRACT

An optoelectronic component including a housing having at least one first cutout and at least one first semiconductor chip arranged in the first cutout, wherein the first cutout is a first reflector that reflects radiation generated during operation of the first semiconductor chip, the first reflector has a surface, and the surface has a targeted setting of an emission characteristic of the radiation emitted by the first semiconductor chip during operation.

21 Claims, 2 Drawing Sheets

(51) Int. Cl.
  *B27N 7/00* (2006.01)
  *B29D 11/00* (2006.01)
  *H01L 25/075* (2006.01)
  *B29C 45/00* (2006.01)
  *H01L 33/48* (2010.01)
  *B29K 101/00* (2006.01)

(52) U.S. Cl.
  CPC ...... *H01L 33/486* (2013.01); *H01L 2924/0002* (2013.01); *H01L 2933/0033* (2013.01); *H01L 2933/0058* (2013.01)

(56) References Cited

U.S. PATENT DOCUMENTS

2007/0269927 A1* 11/2007 Hofer ............... B29C 45/1671
                                                      438/106
2008/0105886 A1   5/2008  Borner et al.
2009/0244903 A1  10/2009  Wong et al.
2010/0210045 A1   8/2010  Kuhmann et al.
2010/0295076 A1  11/2010  Wirth et al.
2013/0200411 A1   8/2013  O'Brien et al.

FOREIGN PATENT DOCUMENTS

| DE | 102006048592 | 4/2008 |
| DE | 102007060202 | 6/2009 |
| DE | 102010012712 | 9/2011 |
| EP | 2 448 027 | 5/2012 |
| JP | 2007-157805 | 6/2007 |
| WO | 2008/043352 | 4/2008 |
| WO | 2010/150824 | 12/2010 |
| WO | 2011/117303 | 9/2011 |
| WO | 2011/157515 | 12/2011 |

* cited by examiner

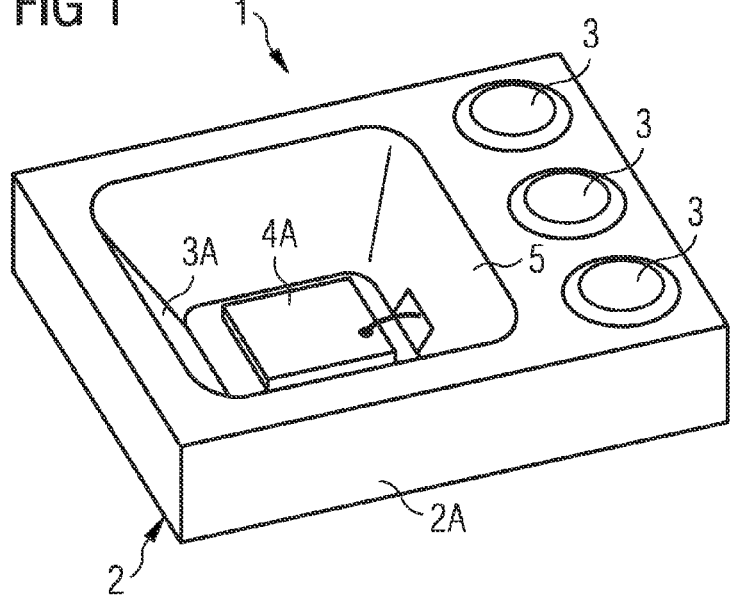
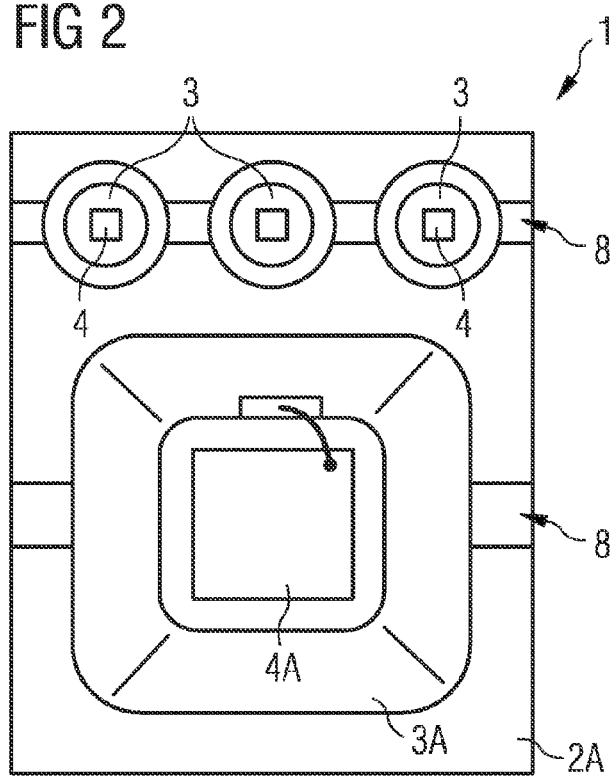

OPTOELECTRONIC COMPONENT AND METHOD OF PRODUCING AN OPTOELECTRONIC COMPONENT

TECHNICAL FIELD

This disclosure relates to an optoelectronic component and a method of producing an optoelectronic component.

BACKGROUND

There is a continuing need for an optoelectronic component which is particularly efficient and cost-effective as well as a method of producing such a particularly efficient and cost-effective optoelectronic component.

SUMMARY

I provide an optoelectronic component including a housing having at least one first cutout, and at least one first semiconductor chip arranged in the first cutout, wherein the first cutout is a first reflector that reflects radiation generated during operation of the first semiconductor chip, the first reflector has a surface, and the surface has a targeted setting of an emission characteristic of the radiation emitted by the first semiconductor chip during operation.

I further provide a method of producing the optoelectronic component including providing the housing which is formed from a plastic, the at least one cutout being formed in the housing, and the cutout having a surface; providing the at least one semiconductor chip; electrodepositing or electroless depositing the metallic layer at least in a region of the surface of the cutout to form a reflective surface and for the targeted setting of the emission characteristic of the radiation emitted by the component during the operation; and arranging the semiconductor chip in the cutout.

I yet further provide a method of producing an optoelectronic component including providing the housing which is formed from a plastic by an injection molding method, wherein the at least one cutout is formed in the housing, the cutout has a surface, and, before injection molding the housing, at least one region of a surface of an injection mold is polished for the targeted setting of the emission characteristic of the radiation emitted by the component during operation; providing the at least one semiconductor chip; applying the metallic layer by sputtering or thermal vapor deposition at least in a region of the surface of the cutout to form a reflective surface; and arranging the semiconductor chip in the cutout.

I still further provide an optoelectronic component including a housing having at least one first cutout, at least one first semiconductor chip arranged in the first cutout, wherein the first cutout is a first reflector that reflects radiation generated during operation of the first semiconductor chip, the first reflector has a surface with a targeted setting of an emission characteristic of the radiation emitted by the first semiconductor chip during operation, the housing has at least one second cutout which is a second reflector, a second semiconductor chip is arranged in the second cutout, the first reflector diffusely reflects the radiation emitted by the first semiconductor chip, and the second reflector directionally reflects the radiation emitted by the second semiconductor chip.

I still further provide an optoelectronic component including a housing having at least one first cutout, at least one first semiconductor chip arranged in the first cutout, the first cutout is a first reflector that reflects radiation generated during operation of the first semiconductor chip, the first reflector has a surface with a targeted setting of an emission characteristic of the radiation emitted by the first semiconductor chip during operation, the housing has at least one second cutout which is a second reflector, a second semiconductor chip is arranged in the second cutout, and the surface roughness of the first reflector is greater than the surface roughness of the second reflector.

BRIEF DESCRIPTION OF THE DRAWINGS

FIG. 1 shows a perspective view of an optoelectronic component.

FIG. 2 shows a plan view of the optoelectronic component from FIG. 1.

DETAILED DESCRIPTION

Figure 3A:
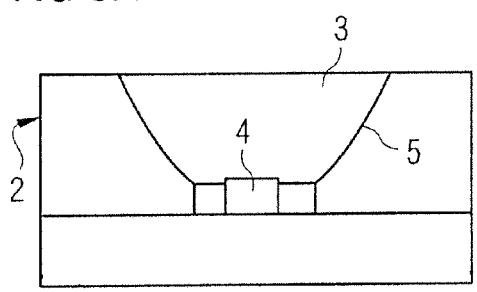
FIG. 3A shows a cross section of at least part of the optoelectronic component from FIG. 1.

The component may comprise at least one first semiconductor chip. The component can comprise a second, third, fourth or even further semiconductor chips. The first semiconductor chip is preferably a semiconductor chip based on a III-V semiconductor material. The first semiconductor chip emits electromagnetic radiation. The first semiconductor chip emits light, for example. However, the first semiconductor chip can also emit ultraviolet (UV) or infrared (IR) radiation. The first semiconductor chip is preferably an LED chip.

The first semiconductor chip can be a high-power semiconductor chip. That is to say that the first semiconductor chip can have a power consumption of at least 1 W, in particular at least 3 W. The first semiconductor chip can be designed for direct lighting. By way of example, the first semiconductor chip can be used as a light emitting chip for the flash function of a camera. The semiconductor chip can also be used particularly well for the backlighting of displays under poor lighting conditions. The first semiconductor chip can also emit IR radiation for the flash function of a cell phone or as an emitter for a distance sensor.

Alternatively, the first semiconductor chip can be a low-energy semiconductor chip. In this case, too, the semiconductor chip can function as an IR emitter for a distance sensor. Alternatively, the semiconductor chip can emit different colors. The semiconductor chip can emit colored, multicolored or white light, for example.

All the semiconductor chips, that is to say the first, the second, the third, the fourth and any further semiconductor chip, of the component can be identical in construction. Alternatively, it is possible for the component to comprise semiconductor chips of different types, in particular also semiconductor chips based on different semiconductor materials, the semiconductor chips preferably designed for emission in different spectral ranges. In this case, different semiconductor chips can be provided for different functions, for example, direct lighting or indirect lighting.

The component furthermore comprises a housing. The component is preferably a surface-mountable component (SMD or surface mounted device). In particular, the housing of the component is surface-mountable. The housing receives the first semiconductor chip. The housing is designed to protect the semiconductor chip against external influences. The housing has at least one first cutout. The cutout is a recess, depression or cavity in a main body of the housing. In principle, any arbitrary form of the cutout is possible. By way of example, an opening of the cutout can have a round, angular or elliptical form in a plan view of the cutout. The cutout is preferably funnel-shaped or conical. The first semiconductor chip is arranged in the first cutout. Preferably, the first semiconductor chip is fixed to a base of the cutout. By way of example, the semiconductor chip is bonded, that is to say in particular soldered or electrically conductively adhesively bonded, onto the base. At the base of the cutout, in this case a connection conductor or a connection location can be exposed, via which the semiconductor chip can be electrically connected.

The first cutout is designed as a first reflector at least in places, in particular completely. The first cutout or the first reflector, respectively, reflects the radiation generated during operation of the first semiconductor chip. The first cutout or the first reflector, respectively, has a surface. The surface is arranged around the first semiconductor chip. The surface is reflective. The surface is designed for the targeted setting of an emission characteristic of the radiation emitted by the first semiconductor chip during operation.

As a result of a targeted configuration of the surface of the first reflector and, in particular, as a result of a targeted choice of properties of the surface, the component can be adapted precisely to the conditions required for its intended use.

By way of example, the surface can be configured at least in places, in particular completely, such that the radiation emitted by the component is reflected directionally or specularly. In particular, the surface can be configured such that it focuses the radiation emitted by the semiconductor chip. In this context, focusing or directional reflection means that the incident radiation is scattered by less than or equal to +/−15° with respect to the surface normal. This can prove to be particularly advantageous if the component emits IR radiation. IR radiation cannot be perceived by a user, for example, a cell phone owner, and so an IR emitting component used, for example, for the IR flash function of the cell phone together with an IR camera is not perceived as irritating, dazzling or disturbing.

As an alternative thereto, the surface can be configured at least in places, in particular completely, such that the radiation emitted by the component is scattered and/or reflected diffusely, i.e. in a plurality of directions. In this context, diffuse scattering and/or reflection means that the incident radiation is scattered by up to +/−60° with respect to the surface normal. This is particularly advantageous, for example, if the component generates visible radiation to not dazzle or irritate a user by radiation focused to an excessively great extent.

As an alternative thereto, the surface can reflect the radiation emitted by the component both directionally or in a focused manner, respectively, and diffusely. That is to say that, at different locations or different regions of the surface, the surface can be embodied in different ways.

As a result of the targeted example of the surface, the emission characteristic of the component can thus be set in a targeted manner depending on the optical requirements made of the component. A particularly efficient component is provided in this way. Since, for the purpose of setting the emission characteristic, the surface is merely configured accordingly and no further component parts, for example, a lens are required, the component is particularly cost-effective.

The surface may have at least one first and at least one second region. The first region can have an extent corresponding to the extent of the second region. As an alternative thereto, the first region can also be larger than the second region, or vice versa. The first region of the surface can be arranged, for example, in a section of the cutout arranged close to the semiconductor chip, that is to say close to the base of the cutout. The second region can be arranged in a section of the cutout which is further away from the semiconductor chip, that is to say, for example, in the region of a coupling-out area of the component. In principle, any spatial arrangement of the first and second regions in the cutout is possible.

The first region of the surface is designed to diffusely reflect and/or scatter the radiation emitted by the first semiconductor chip. In this case, the first region can, in particular, optically expand the radiation. The second region of the surface is designed to reflect the radiation emitted by the first semiconductor chip more directionally than the first region. In particular, the second region of the surface focuses the radiation emitted by the semiconductor chip. In other words, depending on that region of the surface on which the radiation impinges, the radiation is reflected either diffusely or directionally. Radiation impinging on the first region is (diffusely) scattered, for example, in all directions and thus impinges at least partly, reliably also on the second region, by which the radiation is then directionally further reflected. This enables a targeted setting of the emission characteristic of the component in accordance with the optical requirements made of the component.

The first region of the surface may have a higher surface roughness than the second region of the surface. The surface roughness and in particular an arithmetic mean of the absolute values of a roughness measurement of the first region is preferably greater than or equal to the wavelength of the radiation emitted by the first semiconductor chip. The greater the surface roughness, the more diffusely in this case the impinging radiation is reflected by the first region.

Preferably, the surface roughness and in particular the arithmetic mean of the absolute values of a roughness measurement, that is to say the mean roughness value Ra, of the first region is 1.0 to 2.0 times the magnitude of the wavelength of the radiation emitted by the first semiconductor chip. Preferably, the mean roughness value Ra of the first region for a semiconductor chip that emits radiation in the visible range ($\lambda$=0.4 µm to 0.8 µm) is 1 µm to 2 µm, for example, 1.5 µm. Preferably, the mean roughness value Ra of the first region for a semiconductor chip that emits radiation in the IR range ($\lambda$=approximately 1 µm) is greater than or equal to 2 µm, for example, 2.5 µm. In these mean roughness values, the radiation emitted by the semiconductor chip is diffusely reflected by the first region.

The surface roughness and in particular an arithmetic mean of the absolute values of a roughness measurement of the second region is preferably less than the wavelength of the radiation emitted by the first semiconductor chip. The smaller the surface roughness of the second region, the more directionally the radiation impinging on the second region is reflected. Preferably, the surface roughness and in particular the arithmetic mean of the absolute values of a roughness measurement of the second region is 0.1 to 0.9 times the magnitude of the wavelength of the radiation emitted by the first semiconductor chip. For a semiconductor chip that emits IR radiation ($\lambda$=approximately 1 µm), the mean roughness value Ra of the second region is preferably less than or equal to 0.1 µm, for example, 0.09 µm to achieve a specular reflection of the radiation emitted by the semiconductor chip by the second region. For a semiconductor chip that emits visible radiation ($\lambda$=0.4 µm to 0.8 µm), the mean roughness value Ra of the second region is preferably less than or equal to 0.08

μm, for example, 0.04 μm or 0.01 μm to achieve a specular reflection of the radiation emitted by the semiconductor chip by the second region.

The housing may have at least one second cutout. The second cutout is, in particular, a second reflector. The housing can also have a third, fourth or further cutout as a reflector. The second and/or any further cutout can be configured identically to the first cutout. In particular, the second and/or any further cutout can have a diameter of its/their opening facing away from the base areas that is identical to that of the first cutout, and/or a depth identical to that of the first cutout. The second and/or any further cutout can have the same shape as the first cutout. As an alternative thereto, the second and/or any further cutout can have a different size than the first cutout. By way of example, the second and/or any further cutout can have a smaller size or a smaller diameter than the first cutout. Likewise, the second and/or any further cutout can be formed with a smaller depth than the first cutout. The second and/or any further cutout can have a different shape than the first cutout. Preferably, the second and/or any further cutout is shaped in an oval or round fashion.

A second semiconductor chip is arranged in the second cutout. Preferably, the second semiconductor chip is bonded, that is to say in particular soldered or electrically conductively adhesively bonded, onto a base of the second cutout. The first reflector, and in particular the surface of the first reflector reflects the radiation emitted by the first semiconductor chip at least predominantly diffusely. The second reflector, and in particular the surface of the second reflector, reflects the radiation emitted by the second semiconductor chip predominantly directionally. In particular, the second reflector reflects the radiation emitted by the second semiconductor chip more directionally than the first reflector reflects the radiation emitted by the first semiconductor chip.

This configuration is particularly advantageous, for example, to combine an IR emitting semiconductor chip and a semiconductor chip that emits visible radiation in one component. In this case, the radiation emitted by the IR emitting semiconductor chip can preferably be reflected directionally (second semiconductor chip). The visible radiation of the other (first) semiconductor chip is then preferably diffusely scattered and/or reflected. A combination of a multiplicity of semiconductor chips that emit in different spectral ranges is thus possible in one component.

The surface roughness of the first reflector may be greater than the surface roughness of the second reflector. The surface roughness and in particular an arithmetic mean of the absolute values of a roughness measurement of the surface of the first reflector is preferably greater than or equal to the wavelength of the radiation emitted by the first semiconductor chip. The greater the surface roughness, the more diffusely in this case the impinging radiation is reflected and/or scattered by the first reflector or the surface of the first reflector. Preferably, the surface roughness and in particular the arithmetic mean of the absolute values of a roughness measurement of the surface of the first reflector is 1.0 to 2.0 times the magnitude of the wavelength of the radiation emitted by the first semiconductor chip.

The surface roughness and in particular an arithmetic mean of the absolute values of a roughness measurement of the surface of the second reflector is preferably less than the wavelength of the radiation emitted by the second semiconductor chip. The smaller the surface roughness of the second reflector, the more directionally the radiation impinging on the second reflector is reflected. Preferably, the surface roughness and in particular the arithmetic mean of the absolute values of a roughness measurement of the surface of the second reflector is 0.1 to 0.9 times the magnitude of the wavelength of the radiation emitted by the second semiconductor chip.

The housing may be formed from a plastic. The component can be formed, for example, with a so-called molded interconnect device (MID) technology. In this case, the housing is produced in an injection molding method. As an alternative thereto, the component can be formed by the so-called Metal Plated Frame Implementation. Here, too, the housing is preferably produced in an injection molding method. The method of the Metal Plated Frame Implementation is described in WO 2011/157515 A1, the subject matter of which is hereby incorporated by reference.

The surface of the first reflector may at least partly have a metallic layer. This is the case, in particular, for components formed with the aid of MID technology. Preferably, the entire surface of the first reflector has the metallic layer. The metallic layer enables a high yield of the semiconductor chip. The metallic layer serves to reflect the radiation impinging on the surface. The metallic layer can simultaneously function as an electrical connection conductor of the component. The metallic layer can comprise, for example, aluminum (Al), silver (Ag), copper (Cu), nickel (Ni) and/or gold (Au).

The metallic layer in the second region of the first reflector or of the first cutout is preferably thicker than the metallic layer in the first region of the first reflector or of the first cutout. Preferably, the metallic layer in the first region has a thickness corresponding to 10% to 90% of the thickness of the metallic view in the second region. Depending on the roughness of the plastic surface below the metallic layer, the metallic layer in the first region has a thickness of less than or equal to 1 μm, for example, 0.05 μm. The metallic layer in the second region preferably has a thickness of greater than or equal to 10 μm, for example, 15 μm.

As a result of the thicker configuration of the metallic layer in the second region, the second region of the first reflector has a smaller surface roughness than the first region of the first reflector. In particular, the surface of the second region is smooth as a result of the thicker metallic layer in the second region. Thus, radiation impinging on the second region is reflected more directionally than radiation impinging on the first region.

As a result of the targeted application and configuration of the metallic layer, it is thus possible to set the emission characteristic of the component in a targeted manner and to provide a particularly efficient component.

The surface of the second reflector, too, preferably at least partly has a metallic layer. Preferably, the entire surface of the second reflector has the metallic layer. The metallic layer of the first reflector is preferably thinner than the metallic layer of the second reflector. Preferably, the metallic layer of the first reflector has a thickness corresponding to 10% to 90% of the thickness of the metallic view of the second reflector.

As a result of the thicker configuration of the metallic layer in the second reflector, the second reflector has a smaller surface roughness than the first reflector. Thus, radiation emitted by the second semiconductor chip and impinging on the second reflector is reflected more directionally than radiation emitted by the first semiconductor chip and then impinging on the first reflector.

As a result of the targeted application and configuration of the metallic layer, it is thus possible to set the emission characteristic of the component in a targeted manner and provide a particularly efficient component.

I also provide a method of producing an optoelectronic component, preferably the optoelectronic component described above. Preferably, a component based on MID technology is produced by the following method. In particular, the component preferably corresponds to the component described here. All features disclosed for the component are accordingly also disclosed for the method, and vice versa. The method comprises the following steps:

In a first step, the housing is provided. The housing is preferably provided by an injection molding step. The housing is preferably formed from a plastic.

The housing has at least the first cutout described above. Preferably, the housing has a plurality of cutouts, for example, two, three or four cutouts. The cutouts are spatially separated from one another. The respective cutout has a surface. The surface has a method- and material-dictated surface roughness. By way of example, the roughness of the surface is approximately 10 μm.

In a further step, at least one semiconductor chip, in particular the first semiconductor chip described above, is provided. Preferably, a plurality of semiconductor chips, for example, two, three or four semiconductor chips are provided. In this case, the number of semiconductor chips corresponds to the number of cutouts formed in the housing.

In a further step, the metallic layer is formed at least in a region of the surface of the cutout, preferably on the entire surface of the cutout. The metallic layer is formed in this case by electrodeposition or electroless deposition (also called "electroless plating" or "chemical plating") of the metallic layer at least in a region of the surface of the cutout. As a result of the formation of the metallic layer on the surface of the cutout or of the reflector, a reflective surface is formed. The formation of the metallic layer on the surface of the cutout or of the reflector furthermore serves for the targeted setting of the emission characteristic of the radiation emitted by the component during operation. By way of example, the metallic layer is configured such that it is thinner in the above-described first region than in the above-described second region, and/or is thinner in at least one reflector than in at least one further reflector.

In a next step, the semiconductor chip is arranged in the cutout. Preferably, the semiconductor chip is bonded, that is to say in particular soldered or electrically conductively adhesively bonded, onto the base of the cutout.

As described above, the housing obtained by the injection molding step, and in particular the cutout, has a surface roughness predetermined by the production process and the material used. As a result of the targeted formation of the metallic coating, the surface roughness can be set in a targeted manner. In particular, it is possible to form regions/reflectors having higher surface roughness by applying a thinner metallic layer, by which regions/reflectors the impinging radiation can be diffusely scattered and/or reflected. Furthermore, it is possible to form regions/reflectors having lower surface roughness by applying a thicker metallic layer, by which the impinging radiation can be reflected directionally or more directionally than by the regions/reflectors having higher surface roughness. In this regard, the reflection and/or scattering behavior of the respective region/reflector and thus the emission characteristic of the component can be set in a targeted manner. A particularly efficient component is provided as a result. By virtue of the fact that the emission characteristic can be obtained by simple variation of production steps and parameters that are required anyway, and no additional component parts are required, the component or the production thereof is particularly cost-effective.

I provide another method of producing an optoelectronic component, preferably the optoelectronic component described above. Preferably, a component based on the Metal Plated Frame Implementation technology is produced by the following method. In particular, the component produced in this case preferably corresponds to the component described here. All features disclosed for the component are accordingly also disclosed for the method, and vice versa. The method comprises the following steps:

A first step involves providing an injection mold or a mold for injection molding to produce the housing of the component by an injection molding method. A next step involves polishing at least one region of a surface of the injection mold for the targeted setting of the emission characteristic of the radiation emitted by the component during operation. The surface roughness of the injection mold determines the roughness of the surface of the housing produced in the further course of the process, and in particular the surface roughness of the cutout. Consequently, the surface roughness of the respective plastic surface of the housing can be modified or set by the length and/or the intensity and/or the chosen region of the polishing of the injection mold. The more intensely or the longer the surface or the region of the surface of the injection mold is polished, the smaller the surface roughness of that region of the housing which is formed in a next step by the relevant region of the injection mold in the course of the injection molding method.

In this case, for example, that region of the surface of the injection mold provided to shape the first cutout is polished for a shorter time and/or less intensely than that region of the surface of the injection mold provided to shape a further cutout. In this way, the surface roughness of the surface of the further cutout is reduced to a greater extent or is smaller than the surface roughness of the surface of the first cutout. Preferably, that region of the surface of the injection mold provided to form the above-described second region and/or the second reflector is polished more smoothly than that region of the surface of the injection mold provided to form the above-described first region and/or the first reflector. That region of the surface of the injection mold provided to form the above-described first region and/or the first reflector can also remain unpolished, for example.

In a next step, the housing described above is provided by an injection molding step. The housing has at least the first cutout described above. Preferably, the housing has a plurality of cutouts, for example, two, three or four cutouts. The cutouts are spatially separated from one another. The respective cutout has a surface. The surface has a surface roughness set in a targeted manner by the targeted polishing of the surface of the injection mold.

In a further step, at least one semiconductor chip, in particular the first semiconductor chip described above, is provided. Preferably, a plurality of semiconductor chips, for example two, three or four semiconductor chips, are provided. In this case, the number of semiconductor chips corresponds to the number of cutouts formed in the housing.

In a further step, the metallic layer described above is applied at least in a region of the surface of the cutout. Preferably, the metallic layer is applied on the entire surface. In this case, application is effected by sputtering or thermal vapor deposition. A reflective surface is formed in this way. In this case, the metallic layer is preferably so thin that the surface roughness of regions of a reflector or of different reflectors, the surface roughness being set by the polishing of the surface of the injection mold, is not compensated for by the metallic layer. In particular, the metallic layer does not affect the roughness of the surface. The metallic layer maps the surface lying underneath it conformally, for example. Preferably, the metallic layer has a thickness of approximately 100 nm.

In a last step, the semiconductor chip is arranged in the cutout. Preferably, the semiconductor chip is bonded onto the base of the cutout.

The housing obtained by the injection molding step, and in particular the cutout, has—as described above—a surface roughness predefined by the production process, by the polishing of the injection mold, and by the material. The surface roughness of the individual regions of the housing can be set in a targeted manner in particular by the targeted treatment or by the targeted polishing of the surface of regions of the injection mold. In particular, it is possible to form regions/reflectors having higher surface roughness by shorter and/or less intense polishing of the associated regions of the injection mold. These regions/reflectors scatter and/or reflect the impinging radiation diffusely. Furthermore, it is possible to form regions/reflectors having lower surface roughness by longer and/or more intense polishing of the associated regions of the injection mold. These regions/reflectors reflect the impinging radiation directionally or more directionally than the regions having higher surface roughness. In this regard, the reflection and/or scattering behavior of the respective reflector and thus the emission characteristic of the component can be set in a targeted manner. As a result, a particularly efficient component is provided in which the generated radiation is utilized with regard to the use requirements.

By virtue of the fact that the emission characteristic can be obtained by simple variation of production steps and parameters that are required anyway, and no additional component parts are required, the component or the production thereof is particularly cost-effective.

The optoelectronic component and the method are explained in greater detail below on the basis of examples and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size to enable better illustration and/or afford a better understanding.

FIG. 1 shows an optoelectronic component 1. The component 1 comprises a housing 2. The housing 2 is produced from a plastic, preferably by means of an injection molding method. The component 1 is preferably a surface-mountable component. In particular, the housing 2 of the component 1 is surface-mountable.

The housing 2 has four cutouts 3, 3A. In particular, the housing has a first cutout 3A and three further cutouts 3. The housing 2 can also have fewer than four cutouts 3, 3A, for example one, two or three cutouts 3, 3A (not explicitly illustrated). The housing 2 can also have more than four cutouts 3, 3A, for example five, six or seven cutouts (not explicitly illustrated).

The cutouts 3, 3A are formed in a main body 2A of the housing 2. The cutouts 3, 3A constitute depressions in the main body 2A. The cutouts 3, 3A are different. The first cutout 3A has a larger extent than the three further cutouts 3. The first cutout 3A has a larger diameter than the three further cutouts 3. The first cutout 3A can also be deeper than the three further cutouts 3. In an alternative example (not explicitly illustrated), however, the cutouts 3, 3A can also have an identical size.

The cutouts 3, 3A have a different shape. The first cutout 3A is funnel-shaped. However, any further shape is also possible for the first cutout 3A. By way of example, the first cutout 3A can be angular, round or elliptical. The further cutouts 3 have a rounder shape than the first cutout 3A. In an alternative example (not explicitly illustrated), however, the first cutout 3A and any further cutout 3 can also have the same shape.

A semiconductor chip 4, 4A is arranged in the respective cutout 3, 3A. Preferably, the semiconductor chips 4, 4A are bonded to a base of the cutout 3, 3A.

A first semiconductor chip 4A is arranged in the first cutout 3A. The first semiconductor chip 4A is preferably a high-power semiconductor chip. The first semiconductor chip 4A is designed for lighting. The first semiconductor chip 4A emits electromagnetic radiation, preferably light or IR radiation. By way of example, the first semiconductor chip 4A can be used as a light emitting chip for the flash function of a camera. The first semiconductor chip 4A can also emit IR radiation for the flash function of a cell phone with IR camera or as an emitter for a distance sensor.

A respective further semiconductor chip 4 is arranged in the three further cutouts 3. The semiconductor chips 4 are preferably low-energy semiconductor chips. The further semiconductor chips 4 are also designed for lighting. The semiconductor chips 4 emit electromagnetic radiation, preferably light or IR radiation.

In an alternative example, all the semiconductor chips 4, 4A of the component 1 can be identical in construction. The respective cutout 3, 3A is a reflector. In particular, the respective cutout 3, 3A reflects radiation emitted by the respective semiconductor chip 4, 4A directionally or in a focused manner or diffusely or in a scattered manner. In this case, the respective emission characteristic is dependent on the properties of the respective reflector, as described in detail further below.

Figure 4A:
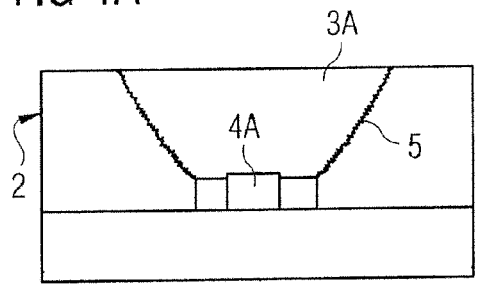
FIG. 4A shows a cross section of at least part of the optoelectronic component from FIG. 1.

The cutouts 3, 3A or reflectors have a reflective surface 5 (see FIGS. 3A and 4A, in particular). The surface 5 faces the respective semiconductor chip 4, 4A. The reflective surface 5 is coated with a metallic layer. The metallic layer can comprise Al, Ag, Cu, Ni and/or Au, for example.

The first reflector formed by the first cutout 3A, has a reflective surface 5 having a high surface roughness (see FIG. 4A). In particular, the surface roughness of the reflective surface 5 of the first reflector is higher than the surface roughness of the respective reflective surface 5 of the further reflectors formed by the further cutouts 3 (in this respect, see FIG. 3A). In this case, the surface roughness of the reflective surface 5 can be influenced by various factors. In one example, the surface roughness is influenced by the thickness of the metallic layer applied to form the reflective surface 5. In a further example, the surface roughness of the respective cutout 3, 3A can be influenced by targeted polishing of that region of the surface of the injection mold provided to form the respective cutout 3, 3A during the production process, as described in detail further below.

The surface roughness and in particular an arithmetic mean of the absolute values of a roughness measurement of the reflective surface 5 of the first reflector is greater than or equal to the wavelength of the radiation emitted by the first semiconductor chip 4A. Preferably, the surface roughness and in particular the arithmetic mean of the absolute values of a roughness measurement of the reflective surface 5 of the first reflector is 1.0 to 2.0 times the magnitude of the wavelength of the radiation emitted by the first semiconductor chip 4A.

The surface roughness and in particular an arithmetic mean of the absolute values of a roughness measurement of the respective reflective surface 5 of the further reflectors formed by the further cutouts 3 is less than the respective wavelength of the radiation emitted by the further semiconductor chips 4. Preferably, the surface roughness and in particular the arithmetic mean of the absolute values of a roughness measurement of the reflective surface 5 of the further reflectors reflector is 0.1 to 0.9 times the magnitude of the wavelength of the radiation emitted by the respective further semiconductor chip 4.

The first reflector, formed by the first cutout 3A, diffusely reflects and/or scatters the radiation emitted by the first semiconductor chip 4A. In this case, the greater the surface roughness of the reflective surface 5 of the first reflector, the more diffusely the impinging radiation is reflected and/or scattered by the reflective surface 5. As a result of a targeted formation of the surface of the reflector, therefore, an emission characteristic 6 of the first semiconductor chip 4A can be set in a targeted manner. In this case, diffuse reflection should be understood to mean the reflection of the incident radiation in all spatial directions. In this context, in particular, diffuse scattering and/or reflection means that the incident radiation is scattered by up to +/−60° with respect to the surface normal (see emission characteristic 6 in FIG. 4B). This is particularly advantageous, for example, if the first semiconductor chip 4A is generates visible radiation to not irritate or disturb a user of the component 1.

The further reflectors formed by the further cutouts 3 reflect the radiation directionally or in a focused manner. In particular, the radiation of the further semiconductor chips 4 is reflected more directionally than the radiation of the first semiconductor chip 4A. In this case, the smaller the surface roughness of the reflective surface 5 of the further reflectors, the more directionally the impinging radiation is reflected by the respective reflective surface 5. In this context, focusing or directional reflection means that the incident radiation is scattered by less than or equal to +/−15° with respect to the surface normal (see emission characteristic 6 in FIG. 3B). This can prove to be particularly advantageous if the respective semiconductor chip 4 emits IR radiation. IR radiation cannot be perceived by a user, for example, a cell phone owner and so an IR emitting component that is used, for example, for the flash function of the cell phone is not perceived as irritating or disturbing.

In a further example (not explicitly illustrated), the first reflector (formed by the first cutout 3A) can also have a smaller surface roughness than the further reflectors such that the radiation emitted by the first semiconductor chip 4A is reflected more directionally than the radiation emitted by the further semiconductor chips 4.

In a further example (not explicitly illustrated), the first reflector or the reflective surface 5 of the first reflector can have different regions. In this case, a first region can have a higher surface roughness than a second region. In this way, the radiation emitted by the first semiconductor chip 4A and impinges on the first region is reflected more diffusely than the radiation impinging on the second region of the reflective surface 5. In this regard, the emission characteristic of the first semiconductor chip 4A can be set in an entirely targeted manner.

In a further example (not explicitly illustrated), the further reflectors (formed by the further cutouts 3) or the respective reflective surface 5 can have in each case the first and second regions described above.

In a further example (not explicitly illustrated), the reflective surface 5 of the first reflector and of at least one of the further reflectors can have the first and second regions described above.

The component 1 described above is produced in accordance with a first example as follows (in this respect, also see FIG. 2). In this case, the production method is oriented toward molded interconnect device (MID) technology, in particular.

In a first step, the housing 2 is provided. The housing 2 is provided by an injection molding method. By this production technique, arbitrarily fashioned housings 2 and arbitrarily fashioned reflectors or cutouts 3, 3A can be produced in a simple manner. The resulting housing 2 is formed from plastic. The respective cutout 3, 3A has, in particular, a surface composed of plastic. In a manner governed by the injection molding method and the material used, the surface of the respective cutout 3, 3A has a certain surface roughness. The surface roughness is initially identical for all the cutouts 3, 3A.

In a further step, the semiconductor chips 4, 4A described above are provided.

In a next step, the reflective surface 5 of the respective cutout is formed. This is done by electrodeposition or electroless deposition of the metallic layer on the surface of the respective reflector. In this case, the metallic layer is deposited such that the metallic layer of the reflective surface 5 of the first reflector is thinner than the metallic layer of the reflective surface of the further reflectors, that is to say of the reflectors formed by the further cutouts 3.

The surface roughness of the plastic surface of the further cutouts 3 is compensated for by the thicker metallic layer on the plastic surface of the further cutouts 3. The reflective surface 5 of the further reflectors thus has a smaller surface roughness than the reflective surface 5 of the first reflector. The reflective surface 5 of the first reflector has a surface roughness corresponding approximately to the surface roughness of the plastic surface situated underneath since the metallic layer of the reflective surface 5 of the first reflector cannot or at least cannot completely compensate for the roughness of the plastic surface on account of its only small thickness. Consequently, as soon as the component 1 is completed, the radiation of the further semiconductor chips 4 is reflected more directionally than the radiation of the first semiconductor chip 4A.

Figure 3B:
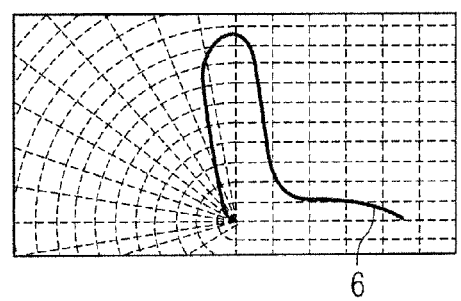
FIG. 3B shows an emission characteristic of the optoelectronic component from FIG. 3A.
Figure 4B:
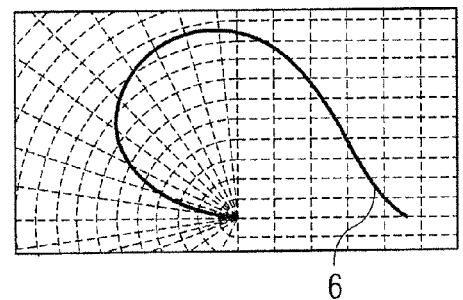
FIG. 4B shows an emission characteristic of the optoelectronic component from FIG. 4A.

As a result of a targeted choice of the thickness of the metallic layer of the respective reflective surface 5, the emission characteristic 6 of the respective semiconductor chip 4, 4A can thus be set in a targeted manner (see FIGS. 3B and 4B). The metallic layer serves as an electrical contact 8 of the component 1, as is illustrated in FIG. 2.

With regard to the example in which the reflective surface 5 of at least one of the four reflectors has the first and second regions described above, a thinner metallic layer is applied in the first region than in the second region. In this way, the first region has a higher surface roughness than the second region. In a last step, the respective semiconductor chip 4, 4A is arranged in the respective cutout 3, 3A. In particular, the first semiconductor chip 4A is arranged in the first cutout 3A, preferably bonded onto the base of the first cutout 3A. The further semiconductor chips 4 are respectively arranged in a further cutout 3, preferably bonded onto the base of the respective further cutout 3.

Finally, the respective reflector can also be filled with a transparent potting material that completely surrounds the respective semiconductor chip 4, 4A (not explicitly illustrated).

The component 1 described above is produced in accordance with a second example as follows (in this respect, also see FIG. 2). In this case, the production method is oriented toward Metal Plated Frame Implementation technology, in particular.

In a first step, the housing 2 described above is provided. The housing 2 is provided by an injection molding method in this case, too. The housing 2 resulting from the injection molding method is formed from plastic and has the cutouts 3, 3A described above. The respective cutout 3, 3A in each case has a surface composed of plastic.

Before injection molding the housing 2, in this method the surface of the injection mold or the mold for injection molding is polished (not explicitly illustrated). The surface roughness of the injection mold determines the roughness of the surface of the housing 2 and, in particular, of the cutouts 3, 3A after the injection molding of the housing 2. Consequently, the surface roughness of the respective plastic surface of the housing 2 can be modified or set by means of the length and/or the intensity of the polishing of the surface of the injection mold.

In this case, that surface of the injection mold that shapes the first cutout 3A in the injection molding step is polished for a shorter time and/or less intensely than that surface of the injection mold provided to shape the further cutouts 3. In this way, the surface roughness of the surfaces of the further cutouts 3 is smaller than the surface roughness of the surface of the first cutout 3 after the production of the housing 2. In other words, after the process of polishing the injection mold and the subsequent injection molding, the surface of the first cutout 3A has a higher surface roughness than the respective surface of the further cutouts 3.

In a manner governed by the injection molding method, the polishing of the injection mold and the material used, the surface of the respective cutout 3, 3A thus has a specific or set surface roughness.

In a further step, the semiconductor chips 4, 4A described above are provided.

In a further step, the reflective surface 5 of the respective cutout 3, 3A is formed. This is done by sputtering or thermal vapor deposition of the metallic layer on the respective plastic surface. In this case, a desired structuring of the metallic layer can be brought about with the aid of a mask. The metallic layer produced in this case is thinner than the metallic layer produced in the above-described method based on MID technology. A method based on MID technology is described in US 2007/0269927, the subject matter of which is hereby expressly incorporated by reference. Preferably, the metallic layer produced has a thickness of approximately 100 nm.

On account of the only small thickness, the metallic layer in this example cannot compensate for the surface roughness of the plastic surface of the respective cutout 3, 3A. In this production method, therefore, compensation of the surface roughness of the plastic surface is effected by the above-described polishing of the injection mold or of the individual regions of the injection mold. The thickness of the metallic layer of the reflective surfaces 5 of the four cutouts 3, 3A is then approximately identical. Since the plastic surfaces of the further cutouts 3 are smoother than the plastic surface of the first cutout 3A, the reflective surface 5 of the first cutout has a higher surface roughness than the reflective surfaces 5 of the further cutouts 3. Consequently, as soon as the component 1 is completed, the radiation of the further semiconductor chips 4 is reflected more directionally than the radiation of the first semiconductor chip 4A.

With regard to the example in which the reflective surface 5 of at least one of the four reflectors has the first and second regions described above, the first region is less smooth than the second region, as a result of the targeted polishing of the injection mold. In this way, the first region has a higher surface roughness than the second region.

In a last step, the respective semiconductor chip 4, 4A is arranged in the respective cutout 3, 3A. In particular, the first semiconductor chip 4A is arranged in the first cutout 3A, preferably bonded onto the base of the first cutout 3A. The further semiconductor chips 4 are respectively arranged in a further cutout 3, preferably bonded onto the base of the respective further cutout 3.

Finally, the respective reflector can also be filled with a transparent potting material that completely surrounds the respective semiconductor chip 4, 4A (not explicitly illustrated).

My components and methods are not restricted to the examples by the description on the basis of those examples. Rather, this disclosure encompasses any novel feature and also any combination of features, which in particular includes any combination of features in the appended claims, even if the feature or combination itself is not explicitly specified in the claims or examples.

The invention claimed is:

1. An optoelectronic component comprising:
a housing having at least one first cutout,
at least one first semiconductor chip arranged in the first cutout, wherein:
the first cutout is a first reflector that reflects radiation generated during operation of the first semiconductor chip,
the first reflector has a surface with a targeted setting of an emission characteristic of the radiation emitted by the first semiconductor chip during operation,
the housing has at least one second cutout which is a second reflector,
a second semiconductor chip is arranged in the second cutout,
the first reflector diffusely reflects the radiation emitted by the first semiconductor chip, and
the second reflector directionally reflects the radiation emitted by the second semiconductor chip.

2. The optoelectronic component according to claim 1, wherein the surface roughness of the first reflector is greater than the surface roughness of the second reflector and/or the respective surface of the first and second reflectors at least partly have a metallic layer, and the metallic layer of the first reflector is thinner than the metallic layer of the second reflector.

3. The optoelectronic component according to claim 1, wherein the surface roughness of the first reflector is greater than the surface roughness of the second reflector.

4. The optoelectronic component according to claim 3, wherein the surface roughness of the first reflector is greater than or equal to the wavelength of the radiation emitted by the first semiconductor chip, and the surface roughness of the second reflector is less than the wavelength of the radiation emitted by the second semiconductor chip.

5. The optoelectronic component according to claim 1, wherein the housing is formed from a plastic.

6. A method of producing the optoelectronic component according to claim 1, comprising:
providing the housing, which is formed from a plastic, the at least one cutout being formed in the housing, and the cutout having a surface;
providing the at least one semiconductor chip;
electrodepositing or electroless depositing the metallic layer at least in a region of the surface of the cutout to form a reflective surface and for the targeted setting of the emission characteristic of the radiation emitted by the component during the operation; and
arranging the semiconductor chip in the cutout, wherein the housing has at least one second cutout which is a second reflector, a second semiconductor chip is arranged in the second cutout, the first reflector diffusely reflects the radiation emitted by the first semiconductor chip, and the second reflector directionally reflects the radiation emitted by the second semiconductor chip.

7. The method according to claim 6, wherein the surface roughness of the first reflector is greater than the surface roughness of the second reflector and/or the respective surface of the first and second reflectors at least partly have a metallic layer, and the metallic layer of the first reflector is thinner than the metallic layer of the second reflector.

8. A method of producing an optoelectronic component according to claim 1, comprising:
providing the housing which is formed from a plastic by an injection molding method, wherein the at least one cutout is formed in the housing, the cutout has a surface, and, before injection molding the housing, at least one region of a surface of an injection mold is polished for the targeted setting of the emission characteristic of the radiation emitted by the component during operation;
providing the at least one semiconductor chip;
applying the metallic layer by sputtering or thermal vapor deposition at least in a region of the surface of the cutout to form a reflective surface; and
arranging the semiconductor chip in the cutout.

9. The method according to claim 8, wherein the surface is smoother in the second region than in the first region as a result of the surface of the injection mold being polished, and/or wherein the surface is smoother in the at least one reflector than in at least one further reflector as a result of the surface of the injection mold being polished.

10. An optoelectronic component comprising a housing having at least one first cutout and at least one first semiconductor chip arranged in the first cutout, wherein the first cutout is a first reflector that reflects radiation generated during operation of the first semiconductor chip, the first reflector has a surface, and the surface has a targeted setting of an emission characteristic of the radiation emitted by the first semiconductor chip during operation, wherein the surface of the first reflector has at least one first and at least one second region, wherein the first region of the surface of the first reflector has a higher surface roughness than the second region of the surface of the first reflector.

11. The optoelectronic component according to claim 10, wherein the first region of the surface of the first reflector diffusely reflects the radiation emitted by the first semiconductor chip, and the second region of the surface of the first reflector reflects the radiation emitted by the first semiconductor chip more directionally than the first region.

12. The optoelectronic component according to claim 10, wherein the surface roughness of the first region is greater than or equal to the wavelength of the radiation emitted by the first semiconductor chip, and the surface roughness of the second region is less than the wavelength of the radiation emitted by the first semiconductor chip.

13. The optoelectronic component according to claim 10, wherein the surface of the first reflector has at least partly a metallic layer, and the metallic layer in the second region is thicker than the metallic layer in the first region.

14. A method of producing an optoelectronic component according to claim 10, comprising:
providing the housing which is formed from a plastic by an injection molding method, wherein the at least one cutout is formed in the housing, the cutout has a surface, and, before injection molding the housing, at least one region of a surface of an injection mold is polished for the targeted setting of the emission characteristic of the radiation emitted by the component during operation;
providing the at least one semiconductor chip;
applying the metallic layer by sputtering or thermal vapor deposition at least in a region of the surface of the cutout to form a reflective surface; and
arranging the semiconductor chip in the cutout.

15. The method according to claim 14, wherein the surface is smoother in the second region than in the first region as a result of the surface of the injection mold being polished, and/or wherein the surface is smoother in the at least one reflector than in at least one further reflector as a result of the surface of the injection mold being polished.

16. An optoelectronic component comprising a housing having at least one first cutout, at least one first semiconductor chip arranged in the first cutout, the first cutout is a first reflector that reflects radiation generated during operation of the first semiconductor chip, the first reflector has a surface with a targeted setting of an emission characteristic of the radiation emitted by the first semiconductor chip during operation, the housing has at least one second cutout which is a second reflector, a second semiconductor chip is arranged in the second cutout, and the surface roughness of the first reflector is greater than the surface roughness of the second reflector.

17. The optoelectronic component according to claim 16, wherein the respective surface of the first and second reflectors at least partly have a metallic layer, and the metallic layer of the first reflector is thinner than the metallic layer of the second reflector.

18. A method of producing the optoelectronic component according to claim 16, comprising:
providing the housing, which is formed from a plastic, the at least one cutout being formed in the housing, and the cutout having a surface;
providing the at least one semiconductor chip;
electrodepositing or electroless depositing the metallic layer at least in a region of the surface of the cutout to form a reflective surface and for the targeted setting of the emission characteristic of the radiation emitted by the component during the operation; and
arranging the semiconductor chip in the cutout, wherein the housing has at least one second cutout which is a second reflector, a second semiconductor chip is arranged in the second cutout, the first reflector diffusely reflects the radiation emitted by the first semiconductor chip, and the second reflector directionally reflects the radiation emitted by the second semiconductor chip.

19. The method according to claim 18, wherein the surface roughness of the first reflector is greater than the surface roughness of the second reflector and/or the respective surface of the first and second reflectors at least partly have a metallic layer, and the metallic layer of the first reflector is thinner than the metallic layer of the second reflector.

20. A method of producing an optoelectronic component according to claim 16, comprising:
providing the housing which is formed from a plastic by an injection molding method, wherein the at least one cutout is formed in the housing, the cutout has a surface, and, before injection molding the housing, at least one region of a surface of an injection mold is polished for the targeted setting of the emission characteristic of the radiation emitted by the component during operation;
providing the at least one semiconductor chip;
applying the metallic layer by sputtering or thermal vapor deposition at least in a region of the surface of the cutout to form a reflective surface; and
arranging the semiconductor chip in the cutout.

21. The method according to claim 20, wherein the surface is smoother in the second region than in the first region as a result of the surface of the injection mold being polished, and/or wherein the surface is smoother in the at least one reflector than in at least one further reflector as a result of the surface of the injection mold being polished.

* * * * *